(12) United States Patent
Kimura

(10) Patent No.: US 12,237,111 B2
(45) Date of Patent: *Feb. 25, 2025

(54) MULTILAYER CERAMIC CAPACITOR

(71) Applicant: Murata Manufacturing Co., Ltd., Nagaokakyo (JP)

(72) Inventor: Masato Kimura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/509,396

(22) Filed: Nov. 15, 2023

(65) Prior Publication Data

US 2024/0087808 A1 Mar. 14, 2024

Related U.S. Application Data

(63) Continuation of application No. 17/739,550, filed on May 9, 2022, now Pat. No. 11,848,155.

(30) Foreign Application Priority Data

May 18, 2021 (JP) ................................ 2021-083829

(51) Int. Cl.
  *H01G 2/06* (2006.01)
  *H01G 4/248* (2006.01)
  *H01G 4/30* (2006.01)

(52) U.S. Cl.
  CPC ............. *H01G 2/065* (2013.01); *H01G 4/248* (2013.01); *H01G 4/30* (2013.01)

(58) Field of Classification Search
  None
  See application file for complete search history.

(56) References Cited

U.S. PATENT DOCUMENTS 11,848,155 B2* 12/2023 Kimura .................. H01G 4/248

OTHER PUBLICATIONS

Kimura, "Multilayer Ceramic Capacitor", U.S. Appl. No. 17/739,550, filed May 9, 2022.

* cited by examiner

*Primary Examiner* — Dion R. Ferguson
(74) *Attorney, Agent, or Firm* — Keating & Bennett, LLP

(57) ABSTRACT

A multilayer ceramic capacitor includes a capacitor main body including a multilayer body and external electrodes, the multilayer body including dielectric layers and internal electrode layers stacked alternately, each of the external electrodes being provided on an end surface in a length direction of the multilayer body and being connected to the internal electrode layers, and two interposers on one surface in a stacking direction of the capacitor main body and spaced apart from each other in the length direction, the interposers including bonding surfaces bondable to the one surface of the capacitor main body and including inner edge portions which are opposite to each other and each having a length longer than a length in a width direction of the multilayer body.

7 Claims, 10 Drawing Sheets

MULTILAYER CERAMIC CAPACITOR

CROSS REFERENCE TO RELATED APPLICATIONS

This application claims the benefit of priority to Japanese Patent Application No. 2021-083829 filed on May 18, 2021. The entire contents of this application are hereby incorporated herein by reference.

BACKGROUND OF THE INVENTION

1. Field of the Invention

The present invention relates to a multilayer ceramic capacitor.

2. Description of the Related Art

Recently, a large-capacitance and small-size multilayer ceramic capacitor has been demanded. Such a multilayer ceramic capacitor includes an inner layer portion in which dielectric layers made of a ferroelectric material having relatively high dielectric constant and internal electrodes are alternately stacked.

Furthermore, the dielectric layers as outer layer portions are disposed at the upper and lower portions of the inner layer portion. As a result, a rectangular parallelepiped-shape multilayer body is provided. Furthermore, the external electrodes are provided on both end surfaces in the length direction of the multilayer body, such that the capacitor main body is provided.

Furthermore, in order to reduce or prevent the generation of so-called "acoustic noise", a multilayer ceramic capacitor having interposers is known (see PCT International Publication No. WO2015/098990). These interposers are located on one side of the capacitor main body. This one side of the capacitor main body is a side on which the substrate is mounted.

SUMMARY OF THE INVENTION

However, sometimes stress due to bending or the like is applied to the substrate on which the multilayer ceramic capacitor is mounted. In that case, the inner edge portion of the bonding surface of the interposer to be bonded to the capacitor main body presses the capacitor main body. As a result, stress is concentrated in the contact portion. Therefore, there is a possibility of cracks occurring in the capacitor main body.

Preferred embodiments of the present invention provide multilayer ceramic capacitors each capable of reducing stress concentration on a capacitor main body caused by contact with an interposer.

A preferred embodiment of the present invention provides a multilayer ceramic capacitor including a capacitor main body including a multilayer body and external electrodes, the multilayer body including dielectric layers and internal electrode layers stacked alternately, each of the external electrodes being provided on an end surface in a length direction of the multilayer body and being connected to the internal electrode layers, and two interposers provided on one surface in a stacking direction of the capacitor main body and spaced apart from each other in the length direction, the two interposers further including bonding surfaces to be bonded to the one surface of the capacitor main body, the bonding surfaces including inner edge portions which are opposite to each other, the inner edge portions each having a length longer than a length in a width direction of the multilayer body.

According to preferred embodiments of the present invention, it is possible to provide multilayer ceramic capacitors each capable of reducing stress concentration on the capacitor main body caused by contact with the interposer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
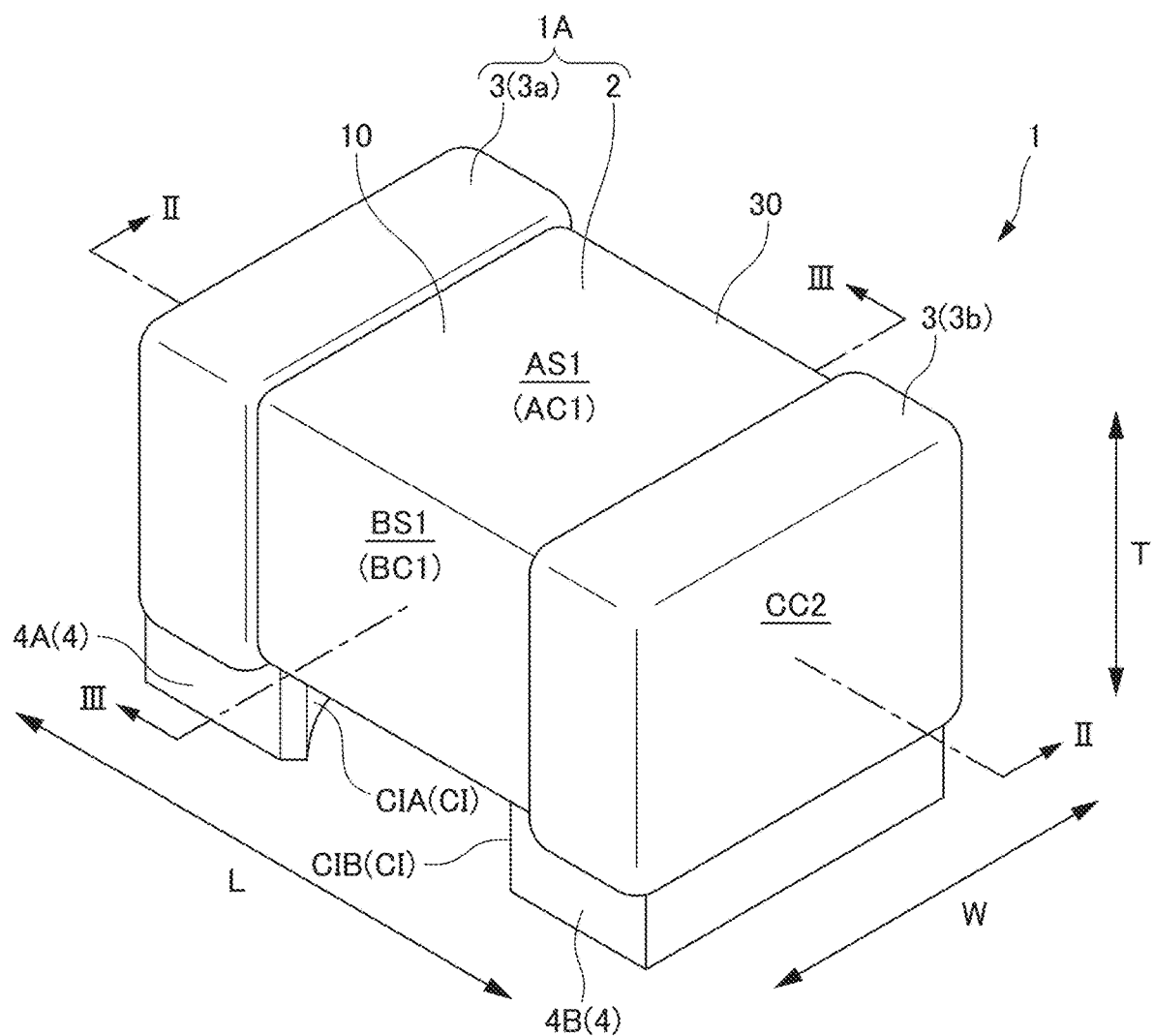
FIG. 1 is a schematic perspective view of a multilayer ceramic capacitor 1 according to a preferred embodiment of the present invention.
Figure 2:
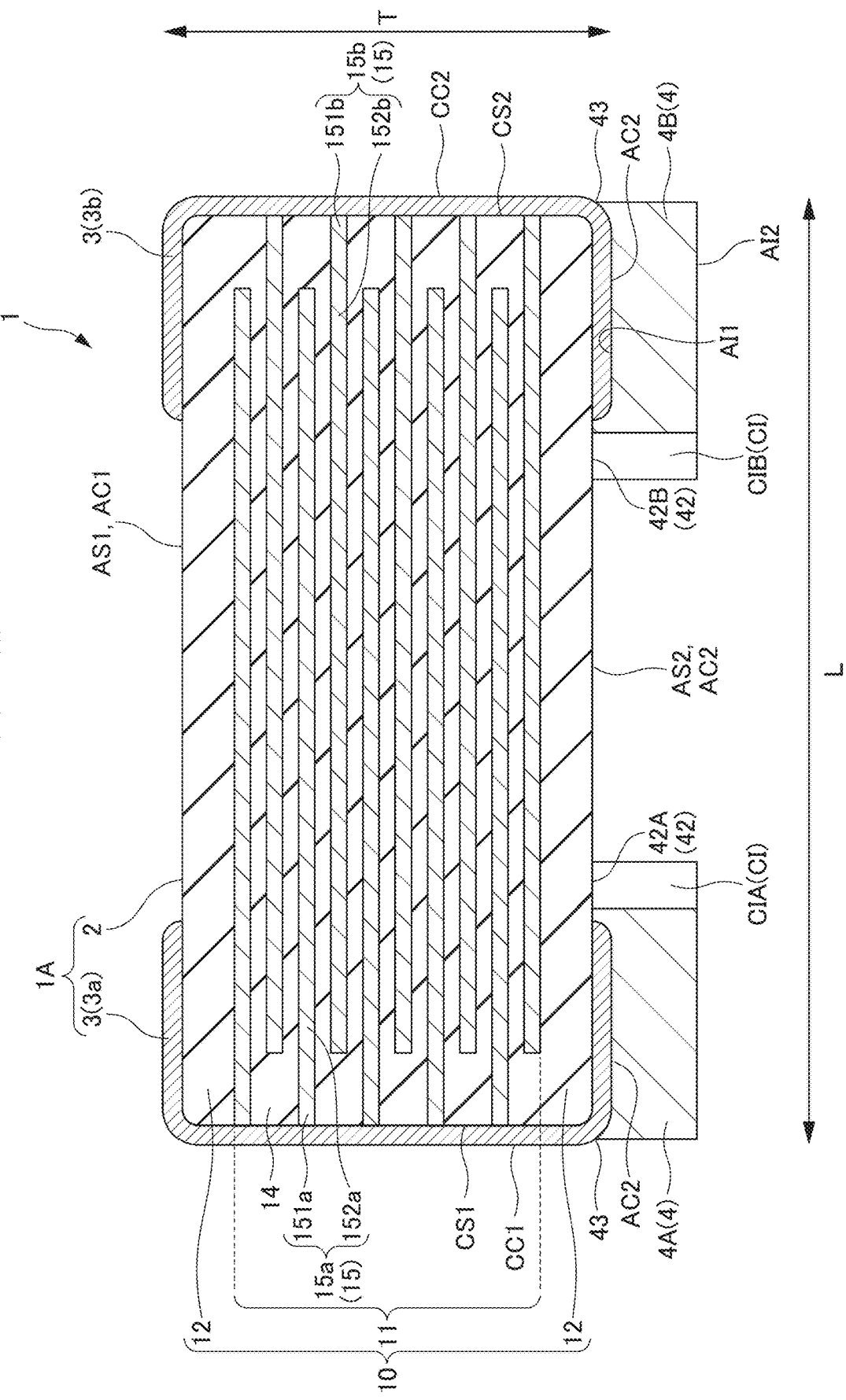
FIG. 2 is a cross-sectional view taken along the line II-II in FIG. 1, of the multilayer ceramic capacitor 1.
Figure 3:
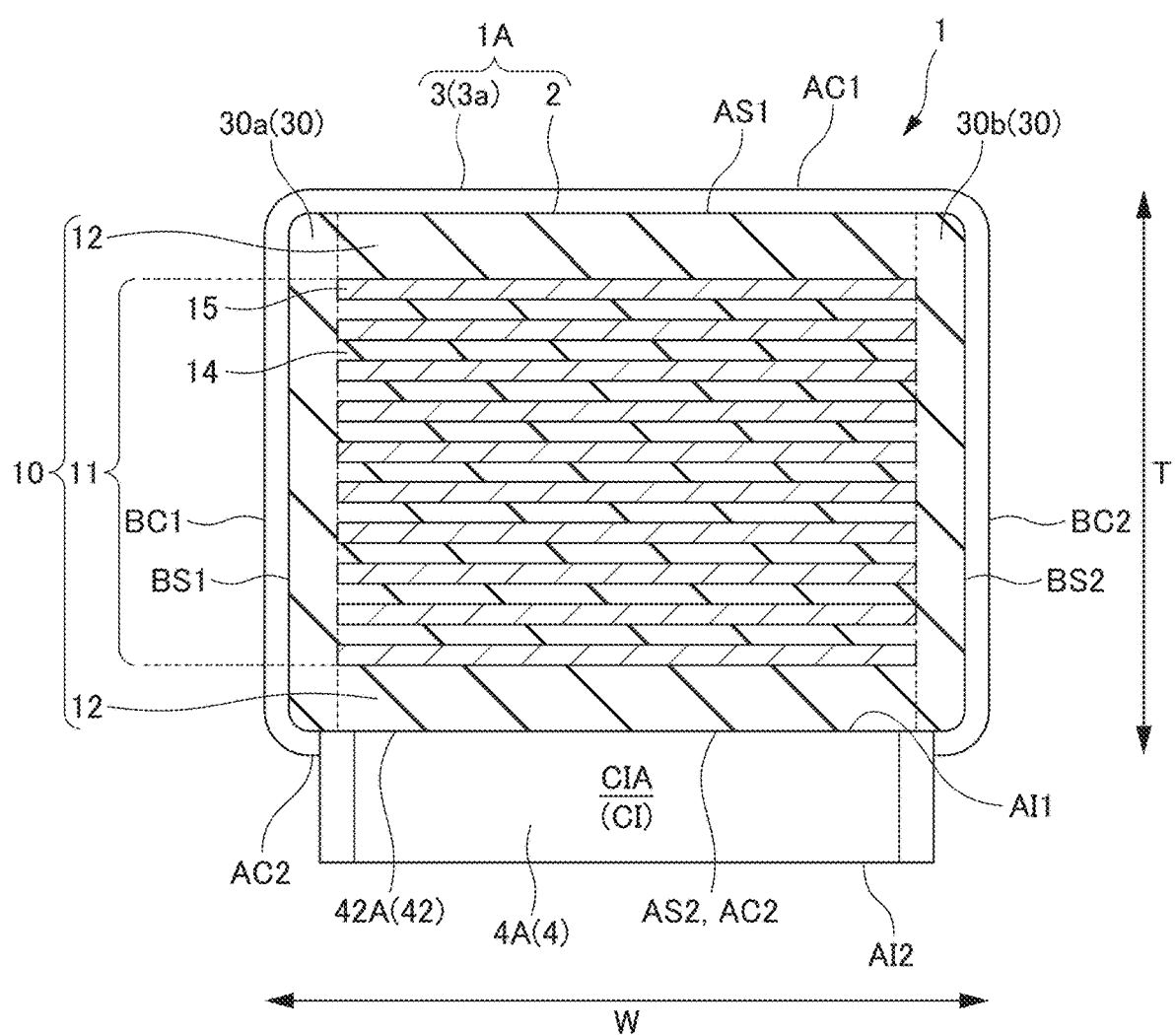
FIG. 3 is a cross-sectional view taken along the line III-III in FIG. 1, of the multilayer ceramic capacitor 1.

Hereinafter, multilayer ceramic capacitors according to preferred embodiments of the present invention will be described. FIG. 1 is a schematic perspective view of a multilayer ceramic capacitor 1 according to a preferred embodiment of the present invention. FIG. 2 is a cross-sectional view taken along the line II-II in FIG. 1, of the multilayer ceramic capacitor 1. FIG. 3 is a cross-sectional view taken along the line III-III in FIG. 1, of the multilayer ceramic capacitor 1.

The multilayer ceramic capacitor 1 has a substantially rectangular parallelepiped shape. The multilayer ceramic capacitor 1 includes a capacitor main body 1A and interposers 4. The capacitor main body 1A includes a multilayer body 2, and a pair of external electrodes 3 provided at both ends of the multilayer body 2. The interposers 4 are attached to the capacitor main body 1A. The multilayer body 2 also includes an inner layer portion 11. The inner layer portion 11 includes a plurality of sets of dielectric layers 14 and internal electrode layers 15.

In the following description, the term representing the direction of the multilayer ceramic capacitor 1 is defined herein. In the multilayer ceramic capacitor 1, the direction in which the pair of external electrodes 3 are provided is defined as the length direction L. The direction in which the dielectric layer 14 and the internal electrode layer 15 are laminated (stacked) is defined as the stacking direction T. The direction intersecting both the length direction L and the stacking direction T is defined as the width direction W. It should be noted that, in the present preferred embodiment, the width direction W is orthogonal or substantially orthogonal to both the length direction L and the stacking (lamination) direction T.

Outer Surface of Multilayer Body 2

Furthermore, a pair of outer surfaces among the six outer surfaces of the multilayer body 2 which are opposite to each other in the stacking direction T are defined as a first main surface AS1 of the multilayer body and a second main surface AS2 of the multilayer body. A pair of outer surfaces among the six outer surfaces of the multilayer body 2 which are opposite to each other in the width direction W are defined as a first side surface BS1 of the multilayer body and a second side surface BS2 of the multilayer body. Furthermore, a pair of outer surfaces among the six outer surfaces of the multilayer body 2 which are opposite to each other in the length direction L are defined as a first end surface CS1 of the multilayer body and a second end surface CS2 of the multilayer body.

When it is not necessary to distinguish between the first main surface AS1 of the multilayer body and the second main surface AS2 of the multilayer body, they are collectively defined as the main surface AS of the multilayer body. When it is not necessary to distinguish the first side surface BS1 of the multilayer body and the second side surface BS2 of the multilayer body, they are collectively defined as the multilayer body side surface BS. Furthermore, when it is not necessary to distinguish the first end surface CS1 of the multilayer body and the second end surface CS2 of the multilayer body, they are collectively defined as the multilayer body end surface CS.

Outer Surface of Capacitor Main Body 1A

Furthermore, a pair of outer surfaces among the six outer surfaces of the capacitor main body 1A which are opposite to each other in the stacking direction T are defined as a first main surface AC1 of the main body and a second main surface AC2 of the main body. A pair of outer surfaces among the six outer surfaces of the capacitor main body 1A which are opposite to each other in the width direction W are defined as a first side surface BC1 of the main body and a second side surface BC2 of the main body. Furthermore, a pair of outer surfaces among the six outer surfaces of the capacitor main body 1A which are opposite to each other in the length direction L are defined as a first end surface CC1 of the main body and a second end surface CC2 of the main body.

When it is not necessary to distinguish between the first main surface AC1 of the main body and the second main surface AC2 of the main body, they are collectively defined as the main surface AC of the main body. Furthermore, when it is not necessary to distinguish between the first side surface BC1 of the main body and the second side surface BC2 of the main body, they are collectively defined as side surfaces BC of the main body. Furthermore, when it is not necessary to distinguish between the first end surface CC1 of the main body and the second end surface CC2 of the main body, they are collectively defined as the end surface CC of the main body.

Outer Surface of Interposer 4

Figure 4:
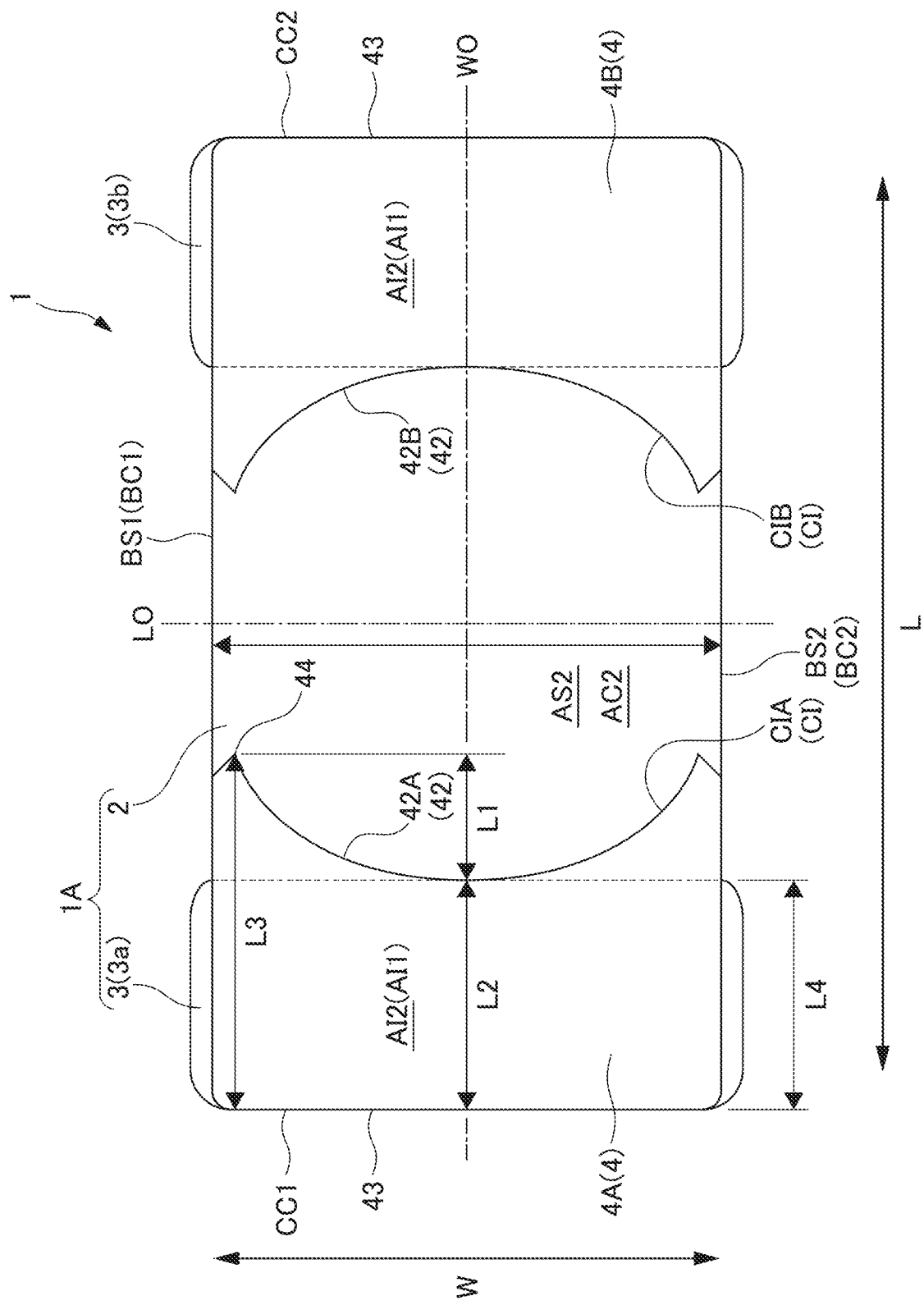
FIG. 4 is a view of the multilayer ceramic capacitor 1 as seen from an interposer 4.

FIG. 4 is a view of the multilayer ceramic capacitor 1 of the present preferred embodiment as seen from the interposer 4. The interposer 4 includes a first interposer 4A and a second interposer 4B. Among the pair of outer surfaces which are opposite to each other in the stacking direction T among the six outer surfaces of the respective interposers 4, an outer surface in the vicinity of the capacitor main body 1A is defined as a bonding surface AI1. Also, among the pair of outer surfaces which are opposite to each other in the stacking direction T among the six outer surfaces of the respective interposers 4, an outer surface in the vicinity of the substrate is defined as a mounting surface AI2.

Furthermore, the surfaces of the first interposer 4A and the second interposer 4B which face each other in the length direction L are defined as a facing surface CIA and a facing surface CIB. When it is not necessary to distinguish between the facing surface CIA and the facing surface CIB from each other, they are collectively defined as the facing surface CI.

The bonding surface AI1 of the interposer 4 and the second main surface AC2 of the main body of the capacitor main body 1A face each other.

Multilayer Body 2

The dimensions of the multilayer body 2 are not particularly limited. However, it is preferable that the dimensions of the multilayer body 2 have a dimension of about 0.2 mm or more and about 10 mm or less in the length direction L, a dimension of about 0.1 mm or more and about 10 mm or less in the width direction W, and a dimension of about 0.1 mm or more and about 5 mm or less in the stacking direction T.

The multilayer body 2 includes a multilayer main body 10 and side gap portions 30. The multilayer main body 10 includes an inner layer portion 11, and outer layer portions 12. The outer layer portions 12 are provided on both sides in the stacking direction T of the inner layer portion 11, respectively. The side gap portions 30 are provided on both sides in the width direction W of the multilayer main body 10.

Inner Layer Portion 11

The inner layer portion 11 includes a plurality of sets of dielectric layers 14 and internal electrode layers 15. The dielectric layer 14 and the internal electrode layer 15 are alternately stacked in the stacking direction T.

The dielectric layer 14 has a thickness of about 0.5 µm or less. The dielectric layer 14 is made of a ceramic material. Examples of ceramic materials include, for example, dielectric ceramics including $BaTiO_3$ as a main component. Furthermore, a ceramic material obtained by adding at least one of sub-components such as Mn compounds, Fe compounds, Cr compounds, Co compounds, and Ni compounds to these main components may be used. It should be noted that the number of dielectric layers 14, including the outer layer portion 12, is preferably 15 sheets or more and 700 sheets or less.

The internal electrode layer 15 includes a plurality of first internal electrode layers 15a and a plurality of second internal electrode layers 15b. The first internal electrode layers 15a and the second internal electrode layers 15b are provided alternately. When it is not necessary to distinguish between the first internal electrode layer 15a from the second internal electrode layer 15b, they are collectively defined as the internal electrode layer 15.

The first internal electrode layer 15a includes a first opposing portion 152a and a first extension portion 151a. The first opposing portion 152a faces the second internal electrode layer 15b. The first extension portion 151a extends from the first opposing portion 152a toward the first end surface CS1 of the multilayer body. The end portion of the first extension portion 151a is exposed on the first end surface CS1 of the multilayer body. The end portion of the first extension portion 151a is electrically connected to a first external electrode 3a to be described later.

The second internal electrode layer 15b includes a second opposing portion 152b and a second extension portion 151b. The second opposing portion 152b faces the first internal electrode layer 15a. The second extension portion 151b extends from the second opposing portion 152b toward the second end surface CS2 of the multilayer body. The end of the second extension portion 151b is electrically connected to the second external electrode 3b to be described later.

A charge is accumulated in the first opposing portion 152a of the first internal electrode layer 15a and the second opposing portion 152b of the second internal electrode layer 15b. As a result, the characteristics of the capacitor are realized.

The internal electrode layer 15 is preferably made of a metal material such as Ni, Cu, Ag, Pd, Ag—Pd alloy, and Au. The internal electrode layer 15 preferably has, for example, a thickness of about 0.5 μm or more and about 2.0 mm. The number of the internal electrode layers 15 is preferably 15 or more and 700 or less as the total of the first internal electrode layer 15a and the second internal electrode layer 15b.

Outer Layer Portions 12

The outer layer portions 12 are made of the same material as the dielectric layers 14 of the inner layer portion 11. The outer layer portions 12 preferably have a thickness of, for example, about 20 μm or less. More preferably, the outer layer portions 12 have a thickness of about 10 μm or less.

Side Gap Portions 30

The side gap portions 30 each include a first side gap portion 30a and a second side gap portion 30b. The first side gap portion 30a is provided in the vicinity of the side surface BS of the multilayer body of the multilayer main body 10. The second side gap portion 30b is provided in the vicinity of the second side surface BS2 of the multilayer body of the multilayer main body 10.

When it is not necessary to distinguish the first side gap portion 30a and the second side gap portion 30b from each other, they are collectively defined as the side gap portion 30.

The side gap portions 30 are each made of a material similar to the dielectric layer 14. The side gap portions 30 each have a thickness of, for example, about 20 μm. The side gap portions 30 each preferably have a thickness of about 10 μm or less.

External Electrodes 3

The external electrodes 3 each include a first external electrode 3a and a second external electrode 3b. The first external electrode 3a is provided on the first end surface CS1 of the multilayer body. The second external electrode 3b is provided on the second end surface CS2 of the multilayer body. When it is not necessary to distinguish between the first external electrode 3a and the second external electrode 3b, they are collectively defined as the external electrode 3. The external electrode 3 covers not only the end surface CS of the multilayer body, but also covers a portion of each of the main surface AS and the side surface BS of the multilayer body. The portion of each of the main surface AS and the side surface BS of the multilayer body is in the vicinity of the end surface CS.

As described above, the end portion of the first extension portion 151a of the first internal electrode layer 15a is exposed on the first end surface CS1 of the multilayer body, and is electrically connected to the first external electrode 3a. Furthermore, the end portion of the second extension portion 151b of the second internal electrode layer 15b is exposed on the second end surface CS2 of the multilayer body, and is electrically connected to the second external electrode 3b. With this configuration, a plurality of capacitor elements are electrically connected in parallel between the first external electrode 3a and the second external electrode 3b.

Interposers 4

The interposers 4 each include a pair of a first interposer 4A and a second interposer 4B. Hereinafter, when it is not necessary to distinguish between the first interposer 4A and the second interposer 4B, they are collectively defined as the interposer 4.

The first interposer 4A is provided in the vicinity of the first end surface CC1 of the main body on the second main surface AC2 of the capacitor main body 1A. The first end surface CC1 of the main body is provided on one side in the length direction L. The second interposer 4B is provided in the vicinity of the second end surface CC2 of the main body on the second main surface AC2 of the capacitor main body 1A. The second end surface CC2 of the main body is provided on the other side in the length direction L. The first interposer 4A and the second interposer 4B are of the same shape and face each other. The first interposer 4A and the second interposer 4B are spaced apart from each other by a predetermined distance.

In the present preferred embodiment, the interposer 4 includes a member including a material containing an intermetallic compound as a main component. The intermetallic compounds include, for example, at least one high melting point metal selected from Cu and Ni, and Sn as a low melting point metal. The interposer 4 includes a single Sn metal apart from the intermetallic compound. The Sn metal included in the interposer 4 achieves favorable solderability in the interposer 4 when mounting the multilayer ceramic capacitor 1 on the substrate.

However, the material of the interposer 4 according to a preferred embodiment of the present invention is not limited to the above-described material. The material of the interposer 4 according to a preferred embodiment of the present invention may be other metals. If the conduction between the external electrode 3 and the substrate is ensured by solder, etc., the interposer 4 may be made of a material other than metal.

Shape of Interposer 4

The bonding surface AI1 of the interposer 4 is bonded to the second main surface AC2 of the main body of the capacitor main body 1A.

The bonding surface AI1 of the first interposer 4A includes an inner edge portion 42. The bonding surface AI1 of the second interposer 4B includes an inner edge portion 42. The inner edge portions 42 face each other in the length direction L.

The first interposer 4A includes an inner edge portion 42A. The second interposer 4B includes an inner edge portion 42B. That is, among the edges of the bonding surface AI1 of the first interposer 4A, the edge closest to the second interposer 4B is the inner edge portion 42A. Furthermore, among the edges of the bonding surface AI1 of the second interposer 4B, the edge closest to the first interposer 4A is the inner edge portion 42B.

When it is not necessary to distinguish between the inner edge portion 42A and the inner edge portion 42B, they are collectively defined as the inner edge portion 42.

As shown in FIG. 4, the inner edge portion 42 of the interposer 4 of the present preferred embodiment is curved in a recessed shape. In the bonding surface AI1 of each interposer 4, the length L2 at the central portion in the width direction W of the inner edge portion 42 is the shortest. The length L3 of both side regions in the width direction W of the inner edge portion 42 is the longest.

It should be noted that the bonding surface AI1 of the interposer 4 in FIG. 4 is not visible. However, the bonding surface AI1 overlaps the mounting surface AI2 in FIG. 4, and has the same shape as the mounting surface AI2.

Both side regions in the width direction W which have the longest length L3 each include not only the end in the width direction W, but also a portion slightly closer to the central portion than the end. In the present preferred embodiment, as shown in FIG. 4, the portion 44 which is slightly closer to the central portion than the end in the width direction W is the longest.

Furthermore, an outer edge portion 43 is disposed on the edge of the bonding surface AI1 opposite to the inner edge portion 42. In the present preferred embodiment, the outer edge portion 43 is not curved. The outer edge portion 43 extends linearly in the width direction W.

When defining the length of the multilayer body 2 as L, the difference L1 between the length L3 of the longest portion and the length L2 of the shortest portion in the bonding surface AI1 is approximately $L \times 0.05 \leq L1 \leq L \times 0.40$. The relationship between the length L2 of the shortest portion and the length L3 of the longest portion in the bonding surface AI1 is approximately $L2 \times 1.10 \leq L3 \leq L2 \times 1.40$. Furthermore, the length of the inner edge portion 42 which is curved is longer than the length in the width direction W of the multilayer body 2, and the length (width) is about 1.1 W or more and about 2 W or less.

In the present preferred embodiment, as shown in FIG. 2, the interposer 4 has a constant or substantially constant LW cross-sectional shape regardless of the position in the stacking direction T when excluding the portion where the external electrode 3 is present.

However, the present invention is not limited thereto. If the inner edge portion 42 is curved, the interposer 4 may have a different profile from the inner edge portion 42 in the lower portion in the stacking direction T from the inner edge portion 42 in the drawings.

In the present preferred embodiment, in the bonding surface AI1 of the interposer 4, even the portion of the shortest length L2 in the length direction L is longer than the length L4 of the portion extending toward the second main surface AC2 of the main body of the capacitor main body 1A in the external electrode 3. Therefore, as shown in FIG. 4, the external electrode 3 is not visible by the inner edge portion 42 of the bonding surface AI1.

Method of Manufacturing Multilayer Ceramic Capacitor

Figure 5:
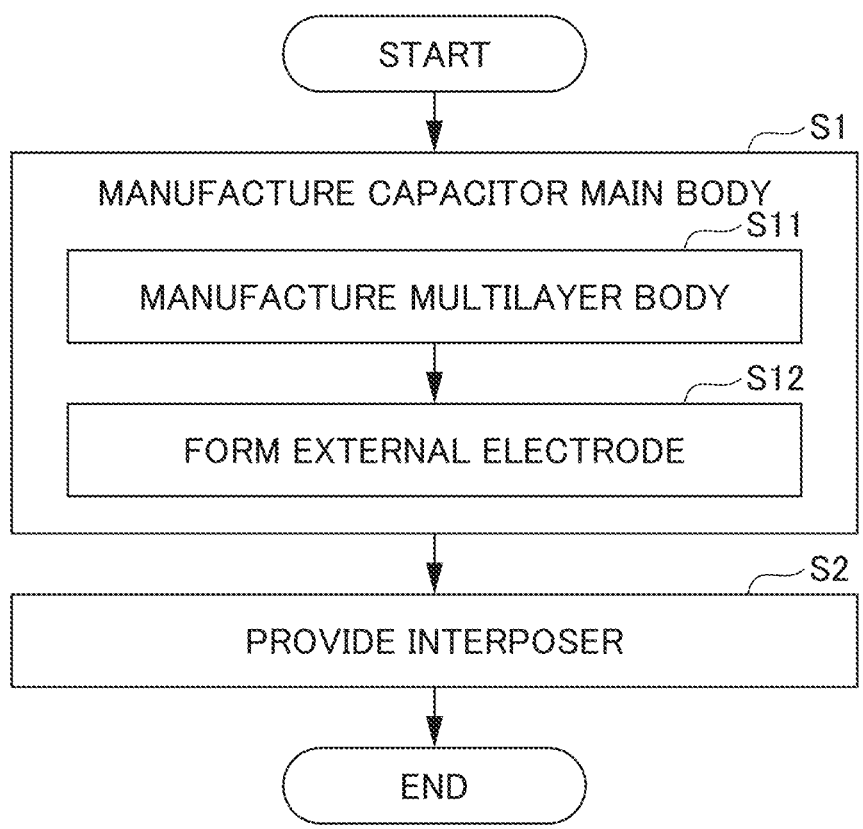
FIG. 5 provides a flowchart showing a method of manufacturing the multilayer ceramic capacitor 1.

FIG. 5 provides a flowchart showing a method of manufacturing the multilayer ceramic capacitor 1. The method of manufacturing a multilayer ceramic capacitor 1 includes a capacitor main body manufacturing step S1, and an interposer providing step S2.

FIGS. 6A to 6D are diagrams illustrating the capacitor main body manufacturing step S1. FIGS. 7A to 7C are diagrams for explaining the interposer providing step S2.

Capacitor Main Body Manufacturing Step S1

The capacitor main body manufacturing step S1 includes a multilayer body manufacturing step S11 and an external electrode forming step S12.

Multilayer Body Manufacturing Step S11

A ceramic slurry includes a ceramic powder, a binder, and a solvent. This ceramic slurry is molded into a sheet form on the carrier film using a die coater, gravure coater, micro gravure coater, etc. In this way, the multilayer ceramic green sheet 101 defining and functioning as a dielectric layer 14 is manufactured.

Then, the conductive paste is printed on the multilayer ceramic green sheet 101 in strips by screen printing, ink jet printing, gravure printing or the like. In this way, the conductive pattern 102 defining and functioning as the internal electrode layer 15 is printed on the surface of the multilayer ceramic green sheet 101, such that the material sheet 103 is manufactured.

Figure 6A:
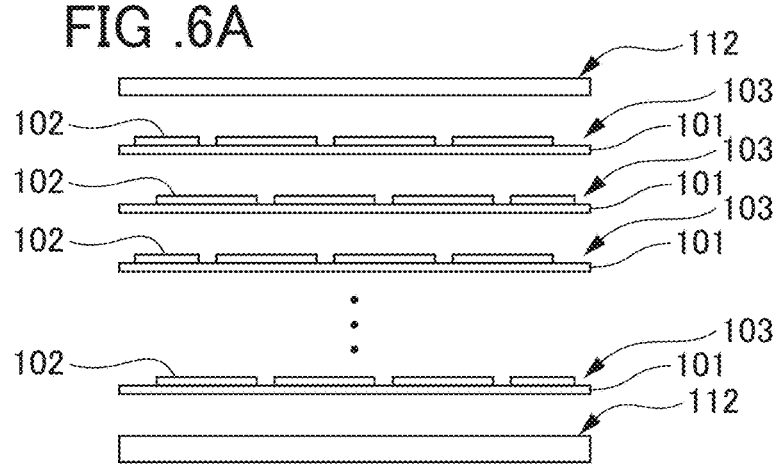
FIG. 6A is a diagram illustrating a capacitor main body manufacturing step S1.
Figure 7A:
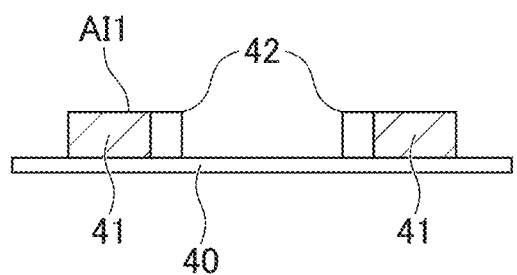
FIG. 7A is a diagram for explaining an interposer providing step S2.
Figure 7B:
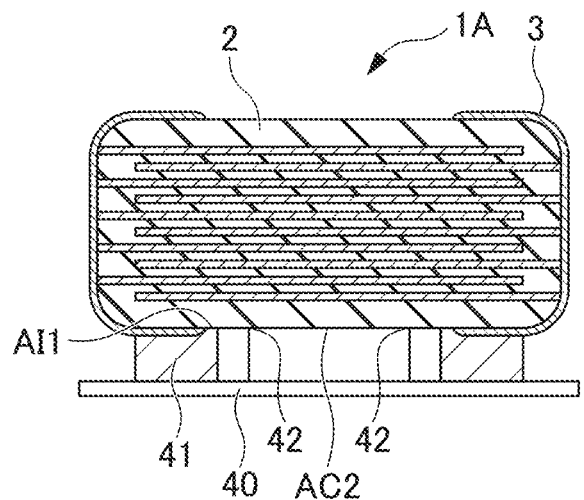
FIG. 7B is a diagram for explaining an interposer providing step S2.
Figure 7C:
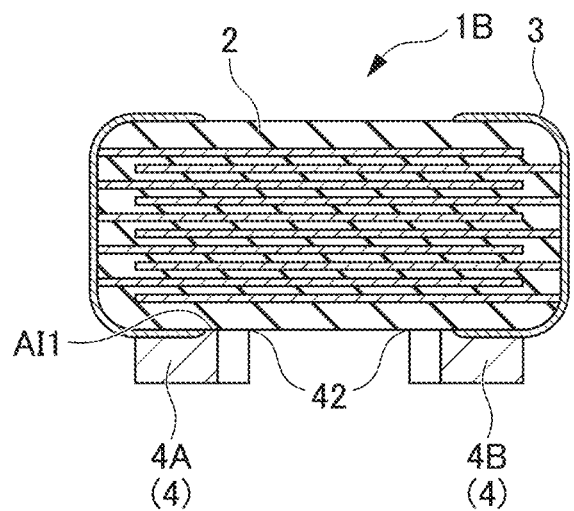
FIG. 7C is a diagram for explaining an interposer providing step S2.

Subsequently, as shown in FIG. 6A, a plurality of material sheets 103 are stacked. The plurality of material sheets 103 are provided so that the conductive patterns 102 are in a state of facing in the same direction and being shifted by half pitch in the width direction between the adjacent material sheets 103.

Furthermore, ceramic green sheets 112 for the upper outer layer portion are stacked on both sides of the plurality of laminated material sheets 103. The ceramic green sheets 112 for the upper outer layer portion function as the outer layer portions 12.

Figure 6B:
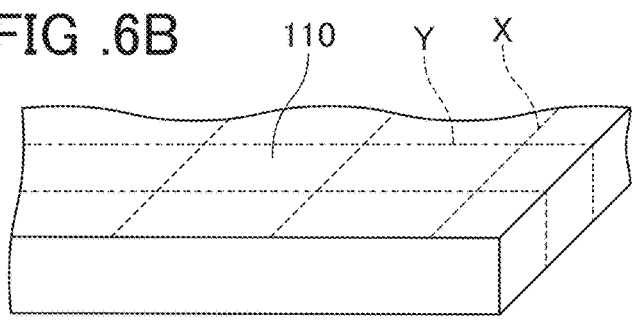
FIG. 6B is a diagram illustrating a capacitor main body manufacturing step S1.

The plurality of laminated material sheets 103 and the ceramic green sheets 112 for the outer layer portions are subjected to thermocompression bonding, to manufacture a mother block 110 shown in FIG. 6B.

Figure 6C:
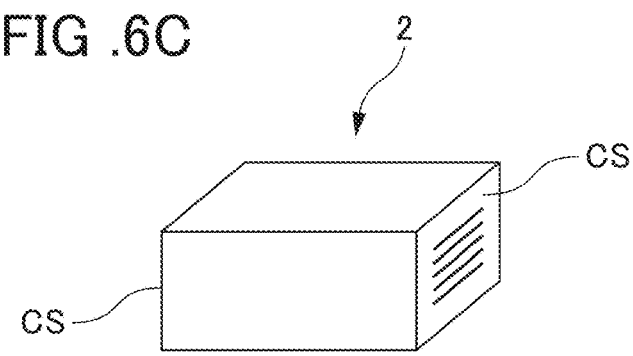
FIG. 6C is a diagram illustrating a capacitor main body manufacturing step S1.

Next, the mother block 110 is cut along the cutting line X and the cutting line Y intersecting the cutting line X shown in FIG. 6B to manufacture a plurality of multilayer bodies 2 shown in FIG. 6C.

External Electrode Forming Step S12

Figure 6D:
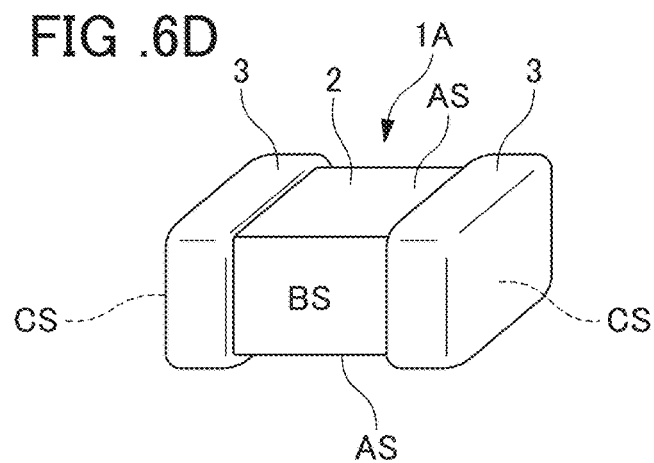
FIG. 6D is a diagram illustrating a capacitor main body manufacturing step S1.

Subsequently, as shown in FIG. 6D, a conductive paste containing a conductive metal and glass is applied to the end surface CS of the multilayer body of the multilayer body 2, and the resulting object is fired to form the external electrodes 3. The external electrodes 3 each cover not only the end surfaces CS of the multilayer body on the both sides of the multilayer body 2, but also extend toward the main surface AS and the side surface of the multilayer body, and thus cover a portion of the main surface AS of the multilayer body in the vicinity of the end surface CS of the multilayer body. Through the above steps, the capacitor main body 1A is manufactured.

Interposer Providing Step S2

A metal material paste defining and functioning as a material of the interposer is prepared. The metal material paste includes at least one high melting point metal selected from Cu and Ni, and Sn as a low melting point metal. In addition, a holding plate 40 is prepared. In the holding plate 40, the metal material paste is not bonded under reflow conditions, for example, as in an alumina plate.

As shown in FIG. 7A, a metal material paste is applied onto the holding plate 40 by a screen printing method, a dispensing method, or the like. As a result, a metal material paste thick film 41 is formed in which the bonding surface AI1, i.e., the inner edge portion 42 is curved.

As shown in FIG. 7B, the capacitor main body 1A is mounted on the holding plate 40 in a posture in which the second main surface AC2 of the main body faces the holding plate 40. At this time, the external electrodes 3 and the metal material paste thick film 41 of the capacitor main body 1A are aligned. In this manner, the metal material paste thick film 41 is attached to the capacitor main body 1A.

In this state, a reflow step is performed. Thus, the metal in the metal material paste thick film 41 produces an intermetallic compound. Furthermore, the metal material paste thick film 41 is cured. Consequently, the interposer 4 in a state of being bonded to the capacitor main body 1A and the external electrode 3 is formed.

Thereafter, the capacitor main body 1A is separated from the holding plate 40 with the interposer 4. As a result, the state shown in FIG. 7C is established.

Through the above steps, the multilayer ceramic capacitor 1 in which the interposer 4 is attached to the capacitor main body 1A is manufactured.

Effects of Preferred Embodiment

There are cases where stress due to bending or the like is applied to the substrate on which the multilayer ceramic capacitor 1 is mounted. At this time, there is a possibility that the inner edge portion 42 of the bonding surface AI1 of the interposer 4 presses the second main surface AC2 of the main body of the capacitor main body 1A.

Here, the ceramic portion of the multilayer body 2 is exposed at the portion where the external electrode 3 of the second main surface AC2 of the main body of the capacitor main body 1A is not provided. This ceramic portion is pressed by the inner edge portion 42 and the stress is concentrated in the ceramic portion, as a result of which cracks may occur.

However, in the present preferred embodiment, the inner edge portion 42 of the bonding surface AI1 of the interposer 4 is curved. That is, the length of the inner edge portion 42 is longer than the length in the width direction W of the multilayer body 2.

Therefore, the concentration of stress on the second main surface AC2 of the main body of the capacitor main body 1A caused by contact with the interposer 4 is alleviated. Therefore, it is possible to reduce the possibility of cracking of the capacitor main body 1A.

Preferred embodiments of the present invention have been described above. However, the present invention is not limited thereto. Various modifications are possible within the scope of the present invention.

(1) First Modification Example

Figure 8:
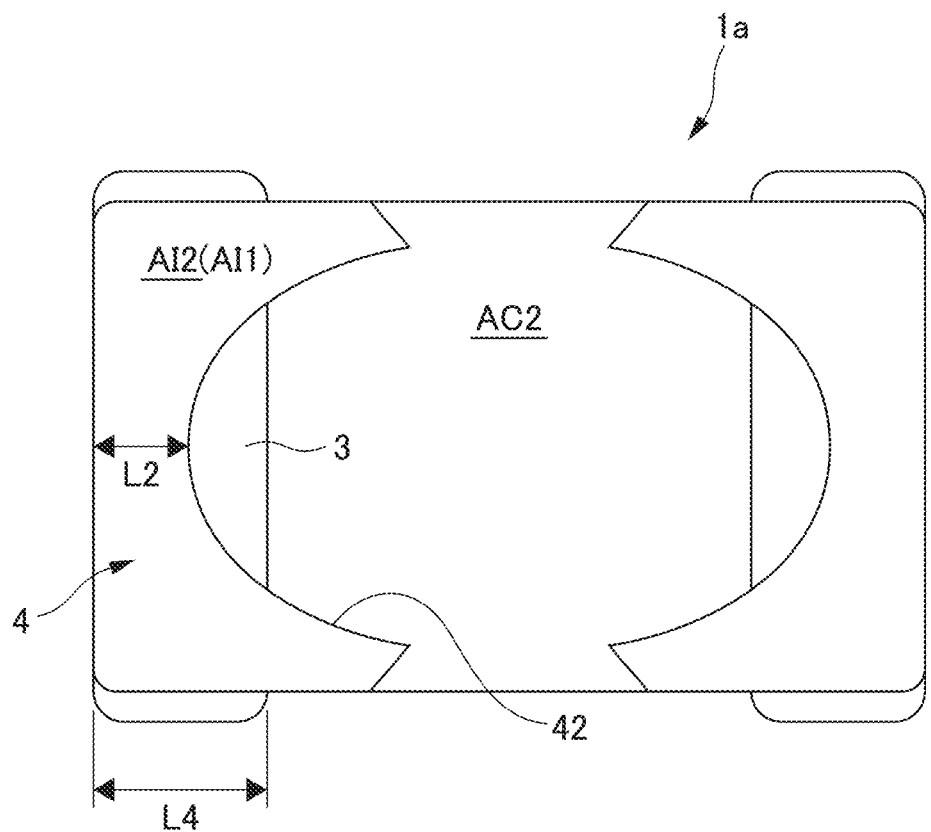
FIG. 8 is a view of a multilayer ceramic capacitor 1a of a first modification example as seen from a mounting surface AI2.

FIG. 8 is a view of the multilayer ceramic capacitor 1a of the first modification example as seen from the mounting surface AI2. In the following description, the same portions as those of the first preferred embodiment are denoted by the same reference numerals.

In the present preferred embodiment, in the bonding surface AI1 of the interposer 4, the shortest length L2 in the length direction L is longer than the length L4 extending toward the second main surface AC2 of the main body of the capacitor main body 1A in the external electrode 3.

However, the present invention is not limited thereto. As shown in FIG. 8, in the bonding surface AI1 of the interposer 4, the shortest length L2 in the length direction L may be shorter than the length L4 of the portion extending toward the second main surface AC2 of the main body of the capacitor main body 1A in the external electrode 3.

In this case, as shown in FIG. 8, the external electrode 3 is exposed from the inner edge portion 42 of the bonding surface AI1.

Also in the first modification example, similarly to the above-described preferred embodiments, the length of the inner edge portion 42 is longer than the length in the width direction W of the multilayer body 2. Therefore, the concentration of stress caused by contact with the interposer 4 onto the second main surface AC2 of the main body of the capacitor main body 1A is alleviated.

Therefore, it is possible to reduce the possibility of cracking of the capacitor main body 1A.

(2) Second Modification Example

Figure 9A:
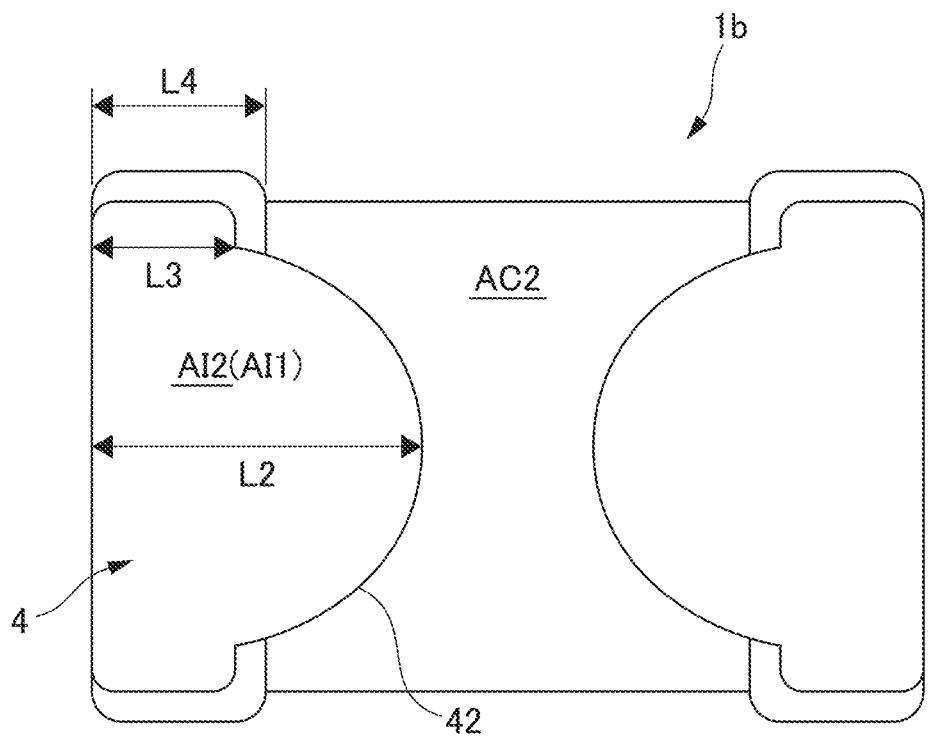
FIG. 9A is a view of a multilayer ceramic capacitor 1b of a second modification example as seen from the mounting surface AI2.
Figure 9B:
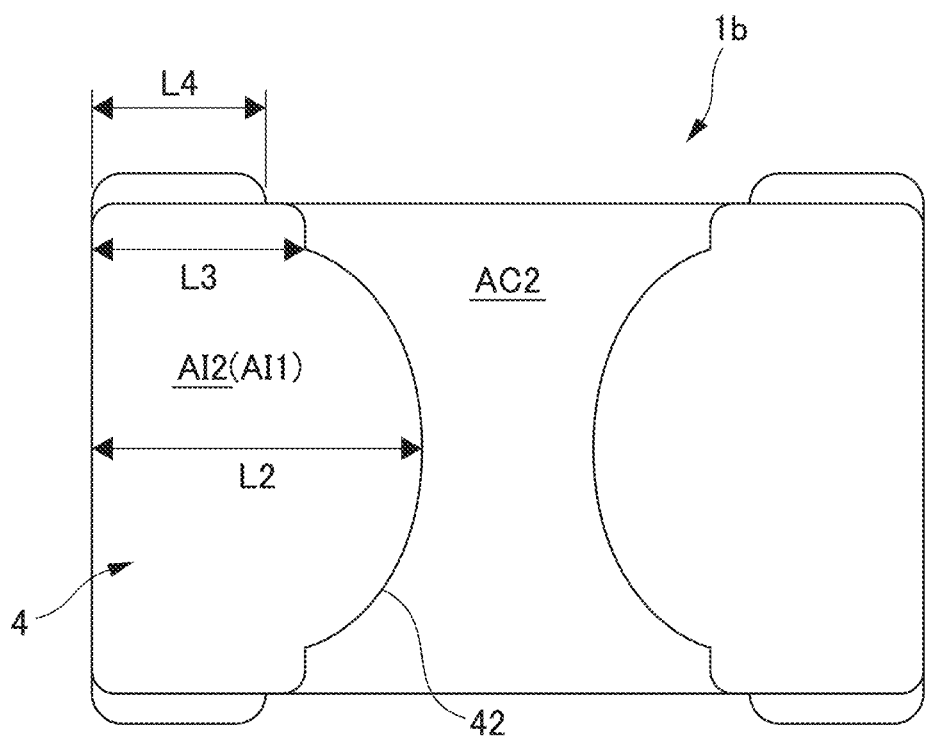
FIG. 9B is a view of a multilayer ceramic capacitor 1b of a second modification example as seen from the mounting surface AI2.

FIGS. 9A and 9B are views of the multilayer ceramic capacitor 1b of the second modification example as seen from the mounting surface AI2. In the following description, the same portions as those of the first preferred embodiment are denoted by the same reference numerals.

The inner edge portion 42 of the interposer 4 of the first preferred embodiment is curved in a recessed shape. In the bonding surface AI1 of each interposer 4, the length L2 at the central portion in the width direction W in the inner edge portion 42 is the shortest, and the length L3 of both side regions in the width direction W in the inner edge portion 42 is the longest.

However, the present invention is not limited thereto. As shown in FIGS. 9A and 9B, the inner edge portion 42 of the interposer 4 is curved convexly. In the bonding surface AI1 of each interposer 4, the length L2 at the central portion in the width direction W in the inner edge portion 42 may be the longest, and the length L3 of both side regions in the width direction W in the inner edge portion 42 may be the shortest.

In FIG. 9A, both ends of the convex inner edge portion 42 are shorter than the length L4 of the portion extending toward the second main surface AC2 of the main body of the capacitor main body 1A in the external electrode 3.

In FIG. 9B, both ends of the convex inner edge portion 42 are longer than the length L4 of the portion extending toward the second main surface AC2 of the main body of the capacitor main body 1A in the external electrode 3.

Also in the second modification example, similarly to the first preferred embodiment, the length of the inner edge portion 42 is longer than the length in the width direction W of the multilayer body 2. Therefore, the concentration of stress caused by contact with the interposer 4 onto the second main surface AC2 of the main body of the capacitor main body 1A is alleviated. Therefore, it is possible to reduce the possibility of cracking of the capacitor main body 1A.

(3) Third Modification Example

Figure 10A:
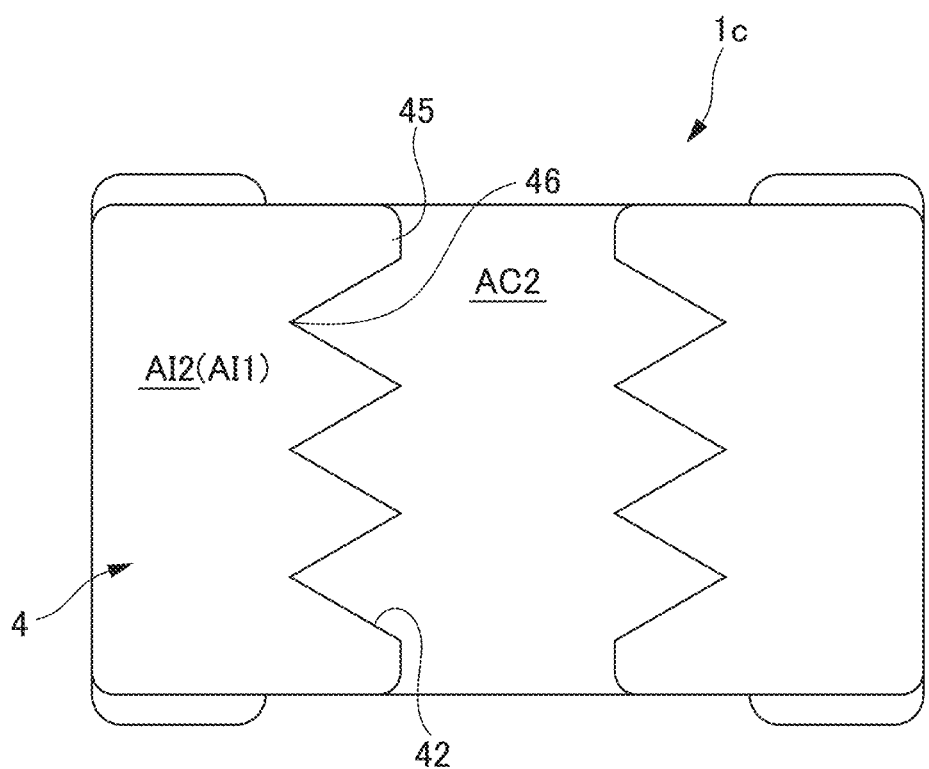
FIG. 10A is a view of a multilayer ceramic capacitor 1c of a third modification example as seen from the mounting surface AI2.
Figure 10B:
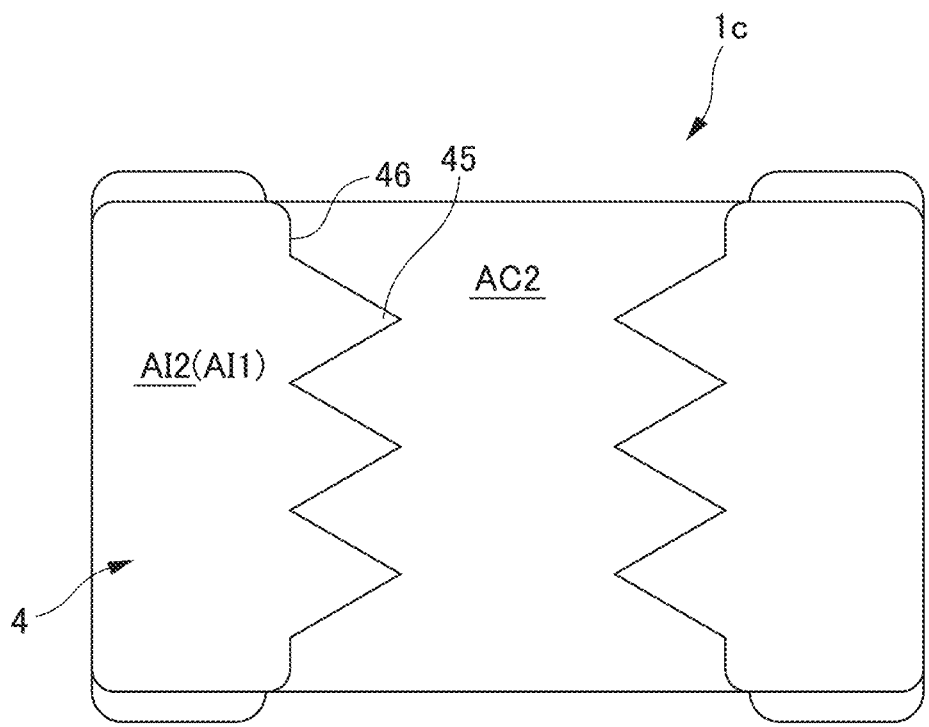
FIG. 10B is a view of a multilayer ceramic capacitor 1c of a third modification example as seen from the mounting surface AI2.

FIGS. 10A and 10B are view of the multilayer ceramic capacitor 1c of the third modification example as seen from the mounting surface AI2. In the following description, the same portions as those of the first preferred embodiment are denoted by the same reference numerals.

The inner edge portion 42 of the interposer 4 of the first preferred embodiment is curved in a recessed shape. In the bonding surface AI1 of each interposer 4, the length L2 at the central portion in the width direction W in the inner edge portion 42 is the shortest, and the length L3 of both side regions in the width direction W in the inner edge portion 42 is the longest.

However, the present invention is not limited thereto. As shown in FIGS. 10A and 10B, the inner edge portion 42 of the interposer 4 may include a plurality of recessed portions 46 and convex portions 45. In FIG. 10A, both ends in the width direction W of the inner edge portion 42 are convex portions 45. In FIG. 10B, both ends in the width direction W of the inner edge portion 42 are recessed portions 46. Also in the third modification example, similarly to the first preferred embodiment, the length of the inner edge portion 42 is longer than the length in the width direction W of the multilayer body 2. Therefore, the concentration of stress caused by contact with the interposer 4 onto the second main surface AC2 of the main body of the capacitor main body 1A is alleviated. Therefore, it is possible to reduce the possibility of cracking of the capacitor main body 1A.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
    a capacitor main body including a multilayer body and external electrodes, the multilayer body including dielectric layers and internal electrode layers laminated therein, two main surfaces opposed to each other in a lamination direction, two side surfaces opposed to each other in a width direction intersecting the lamination direction, and two end surfaces opposed to each other in a length direction intersecting the lamination direction and the width direction, the external electrodes being each provided on a corresponding one of the two end surfaces and connected to the internal electrode layers; and
    a pair of interposers provided on one surface among the two main surfaces and the two side surfaces of the capacitor main body, and spaced apart from and opposed to each other in the length direction; wherein
    the pair of interposers each include a bonding surface to be bonded to the capacitor main body; and
    the bonding surface included in each of surfaces of the pair of interposers which are opposed to each other includes an inner edge portion having a length longer than a length of the multilayer body in the width direction.

2. The multilayer ceramic capacitor according to claim 1, wherein the inner edge portion of the bonding surface includes a curved portion.

3. The multilayer ceramic capacitor according to claim 1, wherein the inner edge portion of each of the pair of interposers has a line symmetrical shape with respect to a straight line passing through a center in the length direction and extending in the width direction, as seen from a plane extending in the width direction and the length direction.

4. The multilayer ceramic capacitor according to claim 1 claim 2, wherein the inner edge portion of each of the pair of interposers has a line symmetrical shape with respect to a straight line passing through a center in the length direction and extending in the width direction, as seen from a plane extending in the width direction and the length direction.

5. The multilayer ceramic capacitor according to claim 1, wherein when defining a length of the multilayer body as L, and defining a difference between a longest portion and a shortest portion in the length direction of the bonding surface as L1, $L \times 0.05 \leq L1 \leq L \times 0.40$ is satisfied.

6. The multilayer ceramic capacitor according to claim 1, wherein a relationship between a length L2 of a shortest portion and a length L3 of a longest portion in the length direction of the bonding surface is $L2 \times 1.10 \leq L3 \leq L2 \times 1.40$.

7. The multilayer ceramic capacitor according to claim 1, wherein when defining a width in the width direction of the multilayer body as W, the length of the inner edge portion is about 1.1 W or more and about 2 W or less.

* * * * *